US010123458B1

United States Patent
Dhote et al.

(10) Patent No.: US 10,123,458 B1
(45) Date of Patent: Nov. 6, 2018

(54) ELECTRICAL SWITCH AND MOUNTING ASSEMBLY THEREFOR

(71) Applicant: EATON CORPORATION, Cleveland, OH (US)

(72) Inventors: Navneet Dhote, Maharashtra State (IN); Pramod Kumar, Peachtree City, GA (US); Pravin Kulkarni, Wagholi Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/586,563

(22) Filed: May 4, 2017

(51) Int. Cl.
| H05K 7/20 | (2006.01) |
| H05K 5/03 | (2006.01) |
| H03K 17/687 | (2006.01) |
| H05K 5/02 | (2006.01) |
| H05K 7/14 | (2006.01) |
| H01L 29/772 | (2006.01) |
| H01L 23/16 | (2006.01) |
| H01L 23/367 | (2006.01) |
| H01L 23/053 | (2006.01) |
| H01L 23/32 | (2006.01) |
| H01L 23/08 | (2006.01) |

(52) U.S. Cl.
CPC ......... *H05K 7/2039* (2013.01); *H01L 29/772* (2013.01); *H03K 17/687* (2013.01); *H05K 5/0204* (2013.01); *H05K 5/03* (2013.01); *H05K 7/14* (2013.01); *H05K 7/20* (2013.01); *H05K 7/2049* (2013.01); *H01L 23/053* (2013.01); *H01L 23/08* (2013.01); *H01L 23/16* (2013.01); *H01L 23/32* (2013.01); *H01L 23/367* (2013.01)

(58) Field of Classification Search
USPC .................. 361/386, 704, 709–711, 718
See application file for complete search history.

(56) References Cited

U.S. PATENT DOCUMENTS

| 4,710,852 A | * | 12/1987 | Keen ................... H01L 23/4093 165/80.3 |
| 5,838,226 A | * | 11/1998 | Houggy ................ G08C 17/02 340/10.31 |
| 6,587,344 B1 | * | 7/2003 | Ross ................... H01L 21/4882 165/185 |
| 7,663,885 B2 | | 2/2010 | Ogawa |

(Continued)

*Primary Examiner* — Dimary Lopez Cruz
*Assistant Examiner* — Zhengfu Feng
(74) *Attorney, Agent, or Firm* — Eckert Seamans

(57) ABSTRACT

A mounting assembly is for an electrical switch. The electrical switch has a heat sink. The mounting assembly includes a switching member, an insulator structured to be located between the switching member and the heat sink, and a separate cover member overlaying the switching member and being structured to secure the switching member and the insulator to the heat sink. The separate cover member includes a body portion and a plurality of protrusions extending outwardly from the body portion. The plurality of protrusions includes a first protrusion and a second protrusion. The switching member is located between the first protrusion and the second protrusion. The plurality of protrusions are structured to extend through the heat sink in order to removably couple the separate cover member and the switching member to the heat sink without requiring a separate fastener to be inserted through the separate cover member.

16 Claims, 7 Drawing Sheets

(56) References Cited

U.S. PATENT DOCUMENTS

| | | |
|---|---|---|
| 7,715,196 B2 | 5/2010 | Chen |
| 2009/0014863 A1 | 1/2009 | Chiang |
| 2009/0244847 A1* | 10/2009 | Chen .................... H05K 7/2049 361/704 |
| 2013/0010428 A1 | 1/2013 | Hayashi |
| 2016/0190025 A1 | 6/2016 | Dhote et al. |

* cited by examiner

ELECTRICAL SWITCH AND MOUNTING ASSEMBLY THEREFOR

BACKGROUND

Field

The disclosed concept relates generally to electrical switches and, more particularly, to electrical switches such as, for example, dimmer switches. The disclosed concept also relates to mounting assemblies for dimmer switches.

Background Information

Electrical switches, such as dimmer switches, are commonly used to control the amount of power delivered to an electrical load, for example, in order to control the intensity of a lighting load, or to control the speed of a ceiling fan.

A dimmer switch is typically mounted to an electrical box disposed in a wall, and is electrically connected between a power source and the electrical load. The dimmer switch generally includes a faceplate coupled to the electrical box, and a user interface, such as a rotating knob, linear slider, or rocker switch, which is movably disposed on the faceplate. The dimmer switch may also include a button or toggle for switching the load ON and OFF. The user interface cooperates with a semiconductor switch, such as field effect transistor (FET), to control the current delivered to the load. That is, the rotating knob or linear slider user interface is movable (i.e., adjustable) to correspondingly to adjust (i.e., control) the current delivered to the load and thus the intensity of the light or the speed of the fan.

A conventional FET mounting assembly 2 is shown in FIG. 1. As shown, the mounting assembly 2 includes a FET 4 mounted to a grounded metal strap 6 (e.g., heat sink). Specifically, the FET 4 includes a metal tab 8 having a thru hole 10. An insulator 12, which also has a thru hole 14, is disposed between the metal tab 8 and heat sink 6 to electrically isolate the components. A screw 16 extends through an insulating bushing 18, which itself extends through hole 10 of metal tab 8, hole 14 of insulator 12, as well as a corresponding thru hole 20 in the metal strap 6, in order to fasten the FET 4 to the heat sink 6. In the example, shown, a washer 22 is disposed between the head of the screw 16 and the shoulder of the insulating bushing 18. Among other disadvantages, such FET mounting schemes are not as robust as desired and are prone to suffer from problematic issues, such as dielectric breakdown. Additionally, known solutions which attempt to address to solve the aforementioned problems of the mounting assembly 2 are deficient in that they typically require burdensome methods of assembly, such as inserting fasteners through other components of mounting assemblies, methods that can result in non-uniform pressure being applied to the FETs. Such solutions are also deficient in terms of dissipating heat by FETs.

There is, therefore, room for improvement in electrical switches and in mounting assemblies therefor.

SUMMARY

These needs and others are met by embodiments of the disclosed concept, which are directed to a mounting assembly for an electrical switch, which among other benefits applies relatively uniform pressure to a switching member, is relatively easy to assemble, and exhibits improved heat dissipation from the switching member.

As one aspect of the disclosed concept, a mounting assembly is provided for an electrical switch. The electrical switch includes a heat sink. The mounting assembly comprises a switching member, an insulator structured to be located between the switching member and the heat sink, and a separate cover member overlaying the switching member and being structured to secure the switching member and the insulator to the heat sink. The separate cover member has a body portion and a plurality of protrusions extending outwardly from the body portion. The plurality of protrusions includes a first protrusion and a second protrusion. The switching member is located between the first protrusion and the second protrusion. The plurality of protrusions are structured to extend through the heat sink in order to removably couple the separate cover member and the switching member to the heat sink without requiring a separate fastener to be inserted through the separate cover member.

As another aspect of the disclosed concept, an electrical switch includes a heat sink and the aforementioned mounting assembly.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
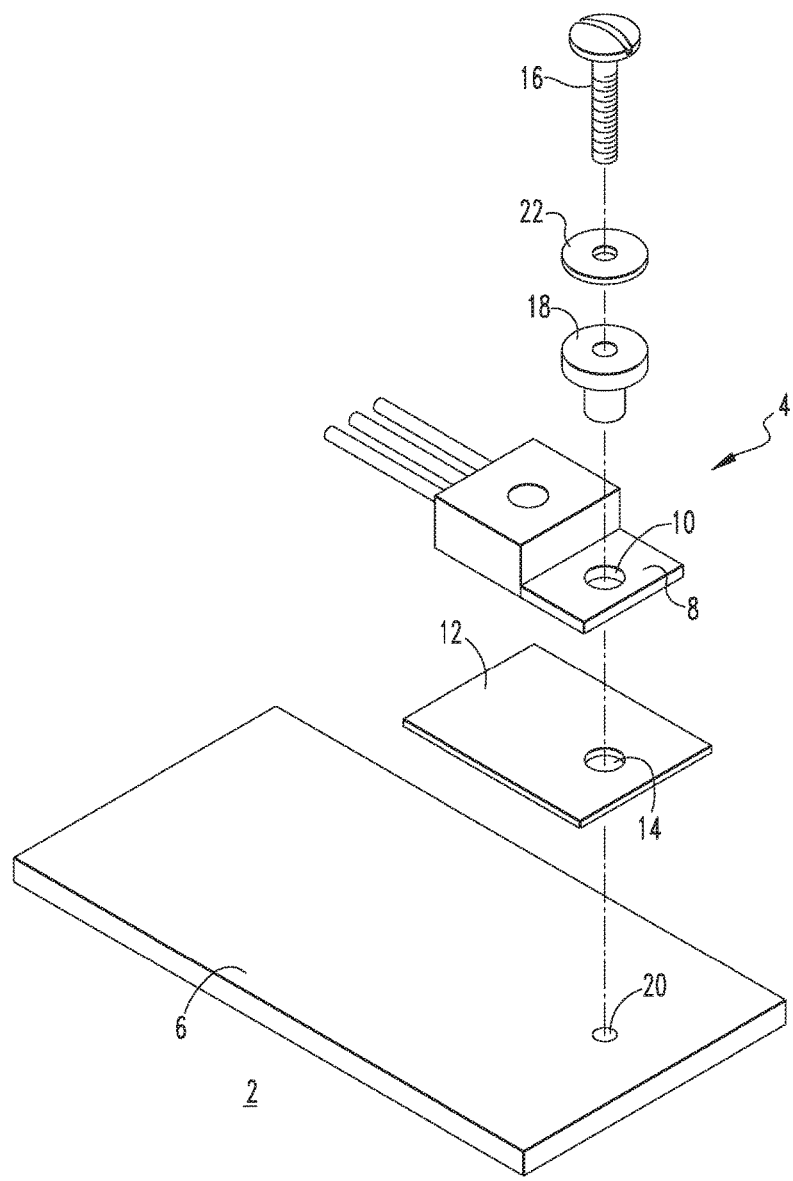
FIG. 1 is an exploded isometric view of a conventional FET mounting assembly.

It will be appreciated that the specific elements illustrated in the FIGS. herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, up, down, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the term "fastener" refers to any suitable connecting or tightening mechanism expressly including, but not limited to, rivets, screws, bolts and the combinations of bolts and nuts (e.g., without limitation, lock nuts) and bolts, washers and nuts.

As employed herein, the statement that two or more parts are "connected" or "coupled" together shall mean that the parts are joined together either directly or joined through one or more intermediate parts.

As employed herein, the statement that two or more parts are "attached" shall mean that the parts are joined together directly.

As employed herein, the statement that two or more parts or components "engage" one another shall mean that the parts touch and/or exert a force against one another either directly or through one or more intermediate parts or components.

As employed herein, the term "liquid crystalline polymer" shall mean a moldable (e.g., without limitation, by injection molding) material that is both thermally conductive and electrically non-conductive (e.g., an electrical insulator) exhibiting dielectric properties and expressly includes, but is not limited to, CoolPoly® D, which is available from Cool Polymers, Inc. having a place of business at 51 Circuit Drive, North Kingstown, R.I. 02852.

Figure 2:
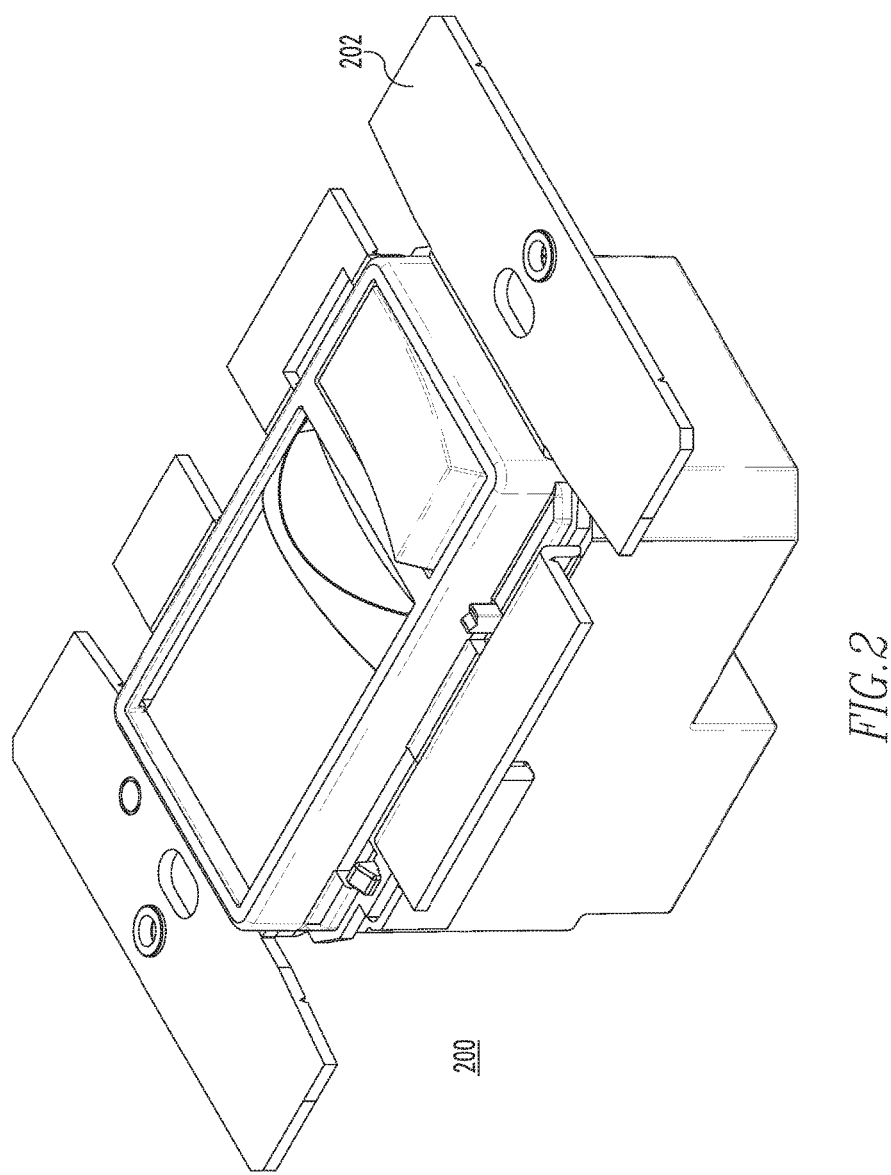
FIG. 2 is an isometric view of a dimmer switch in accordance with an embodiment of the disclosed concept.
Figure 3:
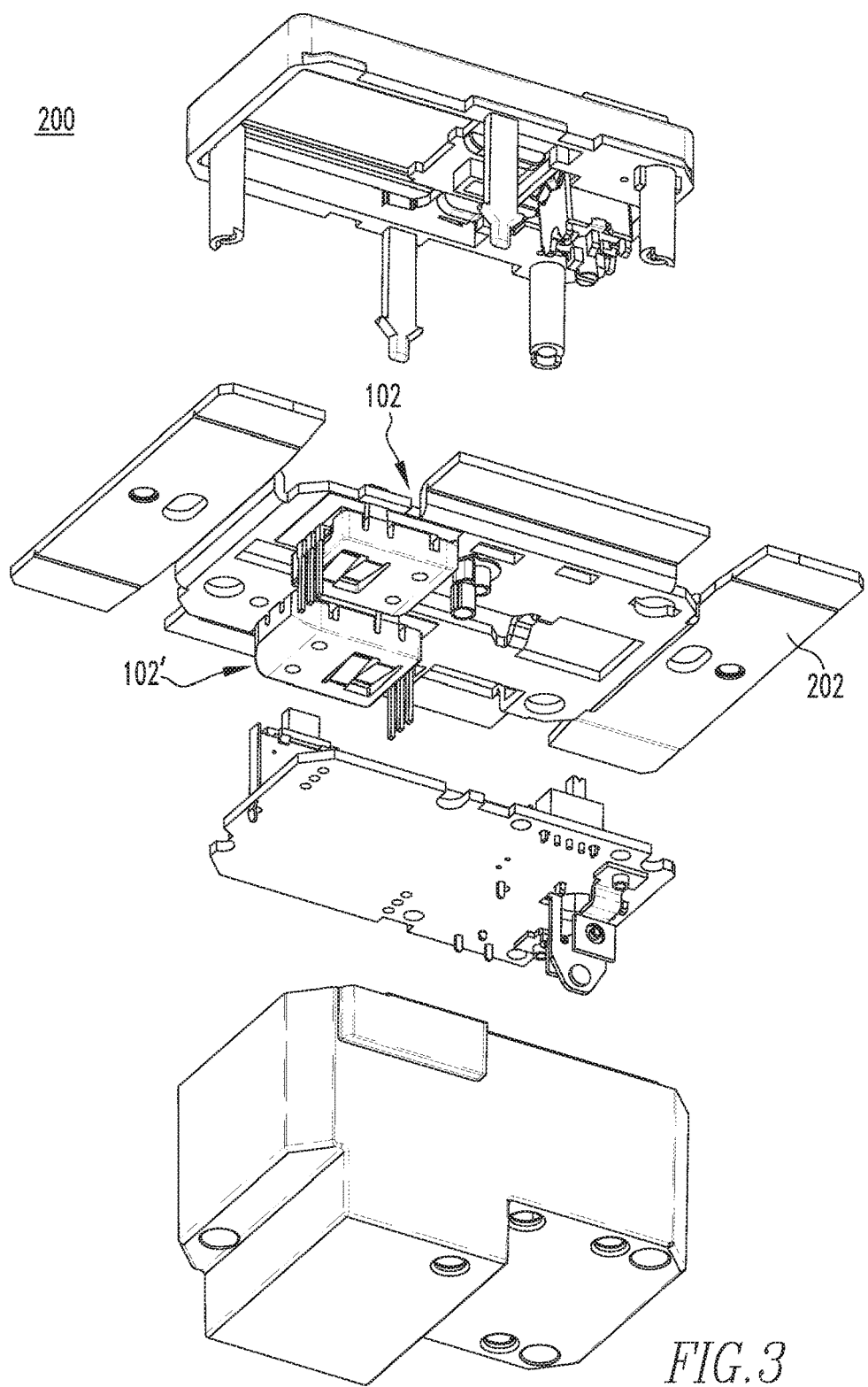
FIG. 3 and FIG. 4 are different exploded isometric views of the dimmer switch of FIG. 2, also showing a mounting assembly therefor, in accordance with an embodiment of the disclosed concept.
Figure 4:
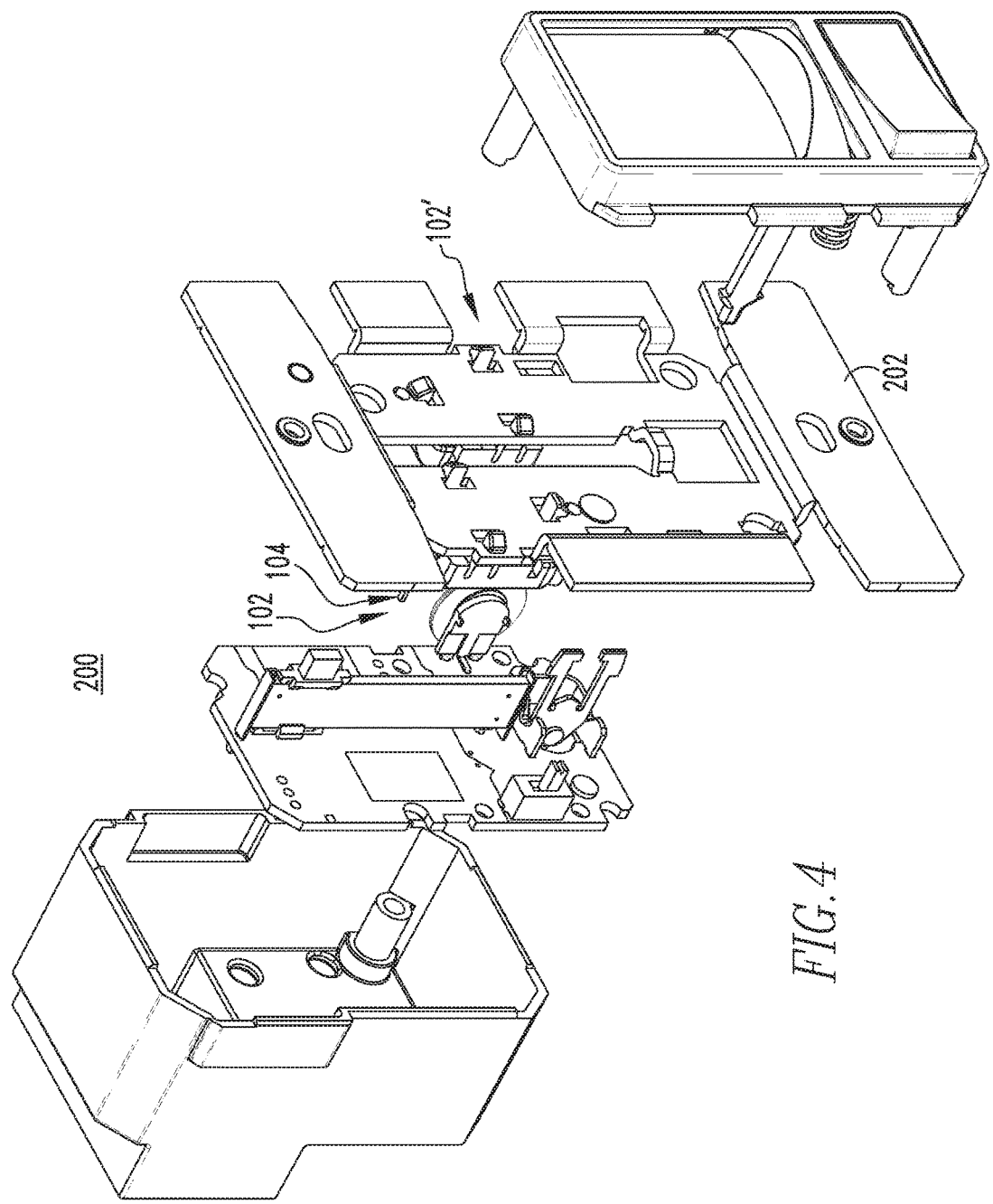

FIGS. 2, 3, and 4 show one non-limiting example of an electrical switch (e.g., without limitation, dimmer switch 200), which is structured to employ a mounting assembly 102 (FIG. 3) in accordance with the disclosed concept. As shown in FIG. 3 (see also FIGS. 4 and 5), the dimmer switch 200 includes a metal strap (e.g., without limitation, heat sink 202) to which the mounting assembly 102 is suitably secured. In the example shown and described herein, the dimmer switch 200 includes two mounting assemblies 102, 102' (both shown in FIG. 3). However, for ease of illustration and economy of disclosure, only one of the mounting assemblies 102 will be shown and described herein, in detail. It will be appreciated that mounting assembly 102' is preferably substantially similar to mounting assembly 102.

Figure 5:
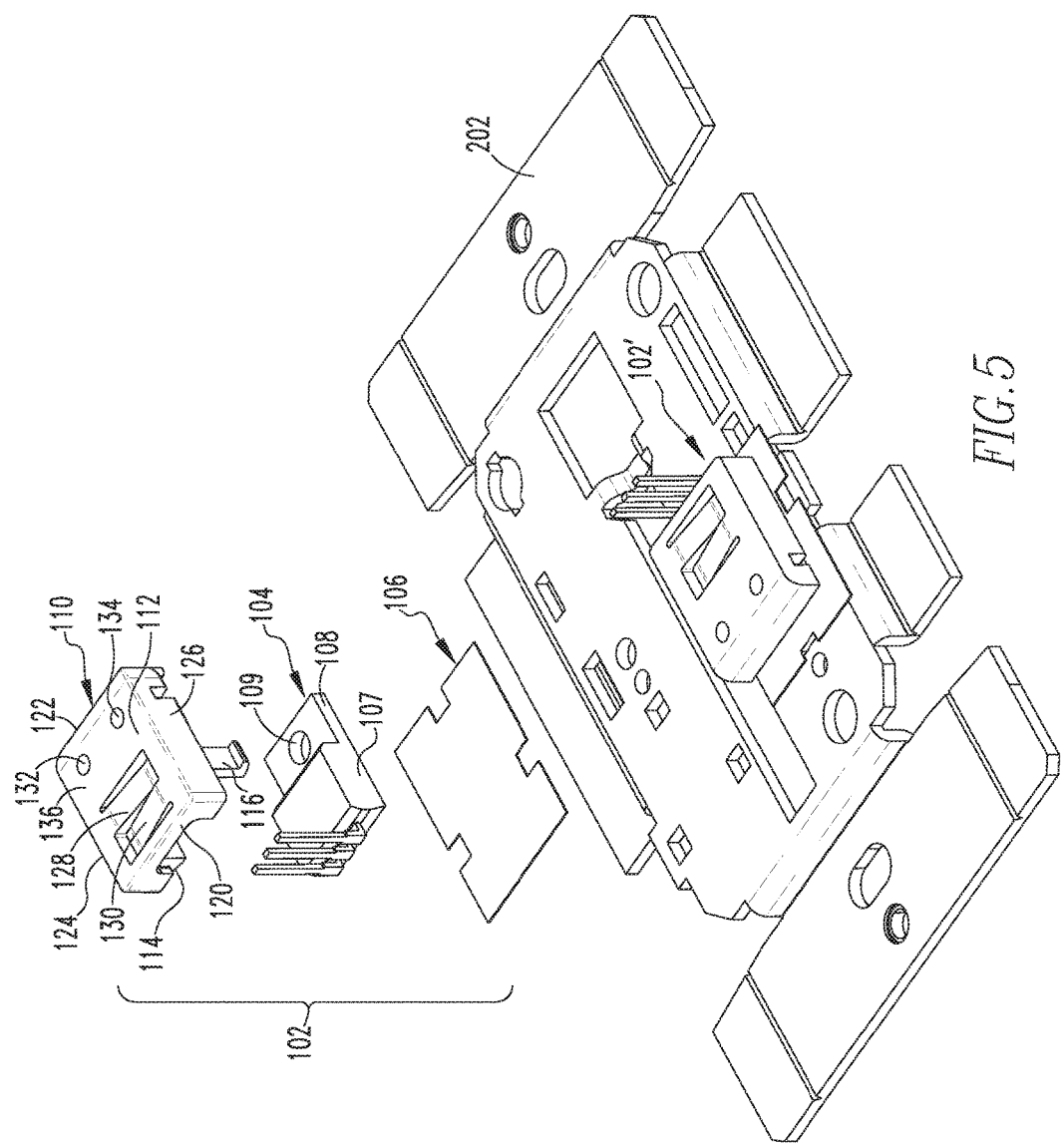
FIG. 5 is a partially exploded isometric view of a portion of the dimmer switch and mounting assembly therefor of FIG. 3 and FIG. 4.

Referring to FIG. 5, the example mounting assembly 102 includes a switching member 104 such as, for example and without limitation, the field effect transistor (FET), shown. An insulator 106 is structured to be disposed between the FET 104 and the heat sink 202 such that the insulator 106 engages the FET 104 and the heat sink 202. A separate cover member 110 overlays the FET 104 and is structured to secure the FET 104 and the insulator 106 (by way of compression force) to the heat sink 202. In one embodiment, the separate cover member 110 is preferably a single-piece molded member made from a liquid crystalline polymer, as defined herein. The FET 104 includes a switch body 107, and a conductive tab 108 having a thru hole 109. The conductive tab 108 extends laterally outwardly from the switch body 107, as best shown in FIG. 5. It will be appreciated that the separate cover member 110 is structured to secure the FET 104 and the insulator 106 to the heat sink 202 without requiring a separate fastener to be inserted through the aforementioned through hole 109 of the conductive tab 108, and also without requiring a separate fastener to be inserted through the separate cover member 110.

Accordingly, the insulator 106 of the disclosed concept provides improved electrical isolation between the conductive tab 108 and the heat sink 202. This avoids dielectric breakdown at relatively high voltages caused from unintentional arcing paths. For example, as shown in FIG. 1, there is a potential arcing path between the metal tab 8 and the screw 16, by way of the thru hole 14 in the insulator 12. Furthermore, as will be discussed in greater detail below, the disclosed mounting assembly 102 is advantageously relatively simple to assemble and couple to the heat sink 202, and also results in relatively uniform pressure being applied to the FET 104.

Figure 6:
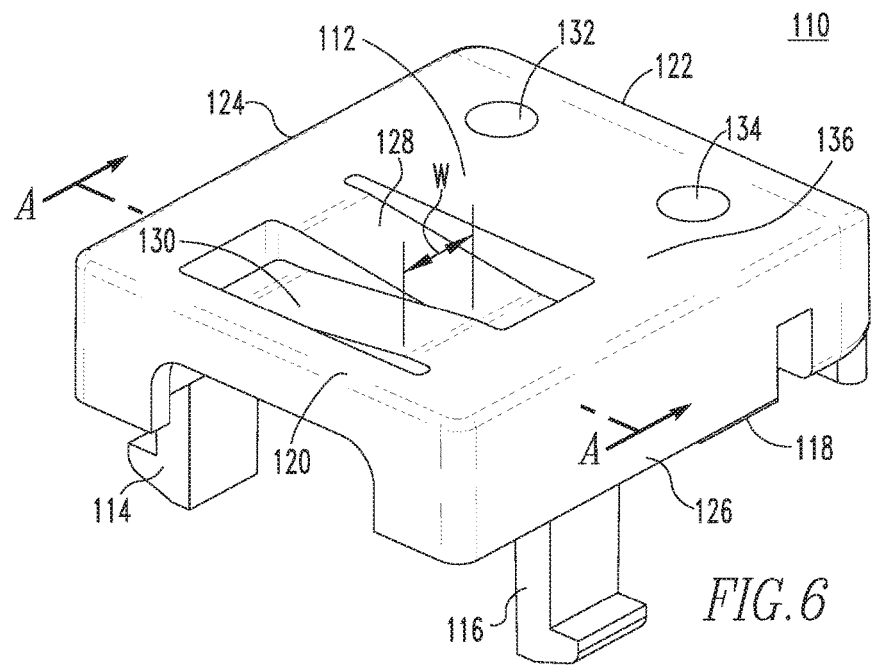
FIG. 6 and FIG. 7 are different isometric views of a cover member for the mounting assembly of FIG. 5.
Figure 7:
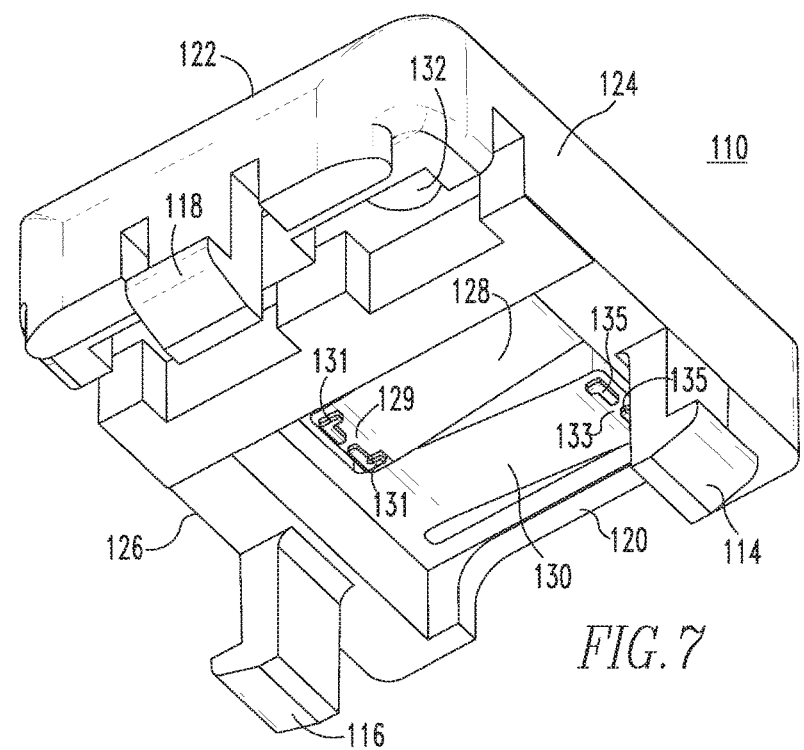
Figure 8:
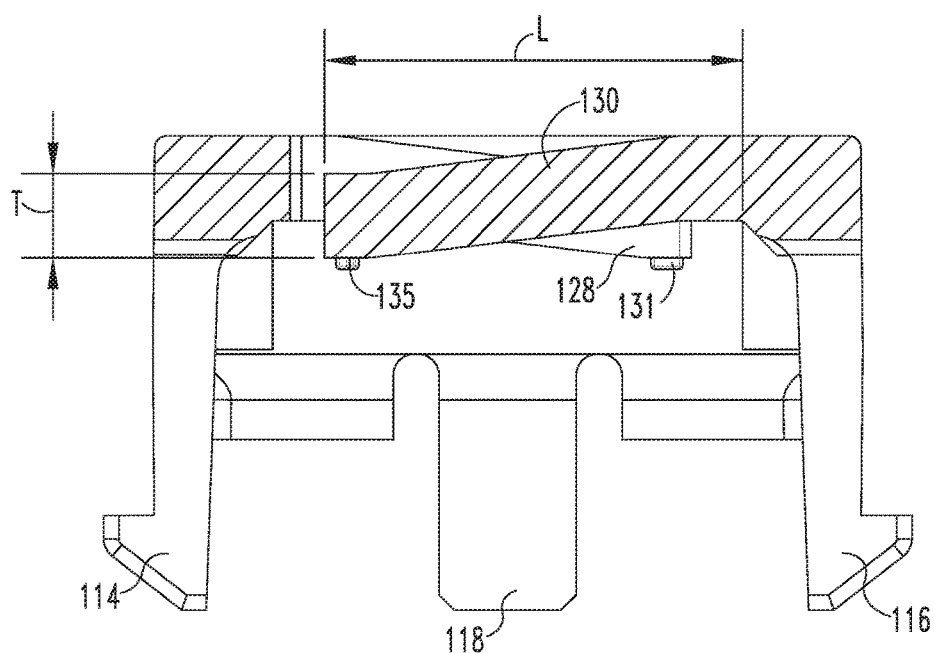
FIG. 8 is a section view of the cover member of FIG. 6 and FIG. 7, taken along line A-A of FIG. 6.

FIGS. 6-8 show different views of the separate cover member 110. As shown in FIGS. 6 and 7, the separate cover member 110 includes a body portion 112 and a plurality of protrusions (three example protrusions 114,116,118 are shown in FIGS. 6 and 7) extending outwardly from the body portion 112. The body portion 112 includes a first end portion 120, a second end portion 122 located opposite and distal the first end portion 120, a first side portion 124, and a second side portion 126 located opposite and distal the first side portion 124. The side portions 124,126 extend from the first end portion 120 to the second end portion 122. As best shown in FIG. 7, the first and second protrusions 114,116 extend from proximate the end first end portion 120 and each extend from a corresponding one of the side portions 124, 126. The third protrusion 118 extends from proximate the second end portion 122, and is located between the first side portion 124 and the second side portion 126. In one example embodiment, the third protrusion 118 is located generally midway between the first side portion 124 and the second side portion 126.

Referring again to FIG. 5, it will be appreciated that the FET 104 is located between the first protrusion 114 and the second protrusion 116, and as a result is reliably maintained on the heat sink 202. Furthermore, because the separate cover member 110 employs the third protrusion 118 extending from proximate the second end portion 122, the separate cover member 110 is advantageously able to be removably coupled to the heat sink 202 without requiring a separate fastener to be inserted through the separate cover member 110.

More specifically, prior art mounting assemblies (not shown) employing separate cover members typically require fasteners to be inserted through the cover members in order for the separate cover members to be reliably maintained on corresponding heat sinks and/or in order to apply pressure to conductive tabs of FETs. By eliminating this manufacturing step, assembly of the dimmer switch 200 and mounting assembly 102 therefor is simplified. Furthermore, by having the separate cover member 110 be the primary mechanism (i.e., without requiring a separate fastener) for maintaining the FET 104 and the insulator 106 on the heat sink 202, and by having protrusions 114,116,118 located at each end portion 120,122, the pressure applied to the FET 104 by the separate cover member 110 is relatively uniform. That is, prior art mounting assemblies (not shown) which rely on cover members having protrusions combined with separate fasteners inserted through cover members typically result in non-uniform distribution of pressure applied to FETs. In one exemplary embodiment, the separate cover member 110 is the sole mechanism for maintaining the FET 104 on the heat sink 202.

Referring again to FIGS. 6 and 7, the cover member 110 further includes a number of projections (two example projections 128,130 are shown in FIGS. 5-8) each structured to bias the FET 104 (FIG. 5) against the insulator 106 and the heat sink 202. The first projection 128 extends from the first side portion 124 to proximate the second side portion 126, and the second projection 130 extends from the second side portion 126 to proximate the first side portion 124. By employing the relatively long projections 128,130, an optimal amount of pressure is advantageously able to be exerted on the FET 104. This is distinct from prior art cover members (not shown), which commonly include relatively short projections.

Continuing to refer to FIG. 6, the body portion 112 of the cover member 110 further has a number of thru holes (two example thru holes 132,134 are shown in the FIGS.). It will be appreciated that when the separate cover member 110 is assembled with the FET 104 (FIG. 5) onto the heat sink 202, the thru holes 132,134 provide a beneficial mechanism for heat from the FET 104 to be dissipated through the cover member 110. Furthermore, the body portion 112 also has a top surface 136 facing away from the FET 104. The top surface 136 extends from the first end portion 120 to the second end portion 122, and from the first side portion 124 to the second side portion 126. In accordance with the disclosed concept, and distinct from prior art mounting assemblies (not shown), the top surface 136 is generally planar. More specifically, prior art mounting assemblies that employ cover members typically require fasteners to be inserted through the cover members, which generally requires top surfaces to be non-planar in order to accommodate the fasteners. By having the planar top surface 136, the cover member 110 is advantageously easier to mold, as compared to cover members (not shown) having non-planar top surfaces.

Referring to FIG. 7, each of the projections 128,130 has a corresponding bottom surface 129,133 facing the FET 104 (FIG. 5), and the cover member 110 further has a corresponding number of protuberances 131,135 extending outwardly from the corresponding bottom surface 129,133 toward the FET 104 (FIG. 5). In the exemplary embodiment, each of the protuberances 131,135 is L-shaped and engages the FET 104. It will be appreciated that the protuberances 131,135 function as a barrier between the FET 104 and the projections 128,130. As a result, direct heat transfer from the FET 104 to the projections 128,130 is reduced, thereby minimizing the likelihood that the projections 128,130 will soften and be structurally compromised in operation. Furthermore, the L-shaped nature of the protuberances 131,135 promotes stability during engagement with the FET 104.

EXAMPLE

In the following EXAMPLE, an analysis of the new mounting assembly 102 (FIG. 5) was evaluated. Specifically, for the test, the following parameters/constants in Table 1, shown below, associated with the mounting assembly 102 and cover member 110 therefor, were employed. See, for example, FIGS. 6 and 8 for parameters W, L, and T.

TABLE 1

Parameters and constants associated with mounting assembly 102

| PARAMETERS/ CONSTANTS | SYMBOL | BASE VALUE | UNIT |
| --- | --- | --- | --- |
| WIDTH | W | 2.61 | mm |
| LENGTH | L | 9.00 | mm |
| THICKNESS | T | 1.60 | mm |
| DEFLECTION OF PROJECTION UPON ENGAGEMENT WITH FET | δ | 0.72 | mm |
| MODULUS OF ELASTICITY OF COVER MEMBER | t | 2860 | MPa |
| CONTACT AREA OF FET ON INSULATOR | A | 146 | mm² |

Table 2 below shows outputs associated with the mounting assembly 102 that were generated during the test.

TABLE 2

| Outputs associated with mounting assembly 102 | | |
| --- | --- | --- |
| FORCE OF ONE PROJECTION ON FET | 7.55 | N (NEWTONS) |
| FORCE OF BOTH PROJECTIONS ON FET | 15.10 | N (NEWTONS) |
| PRESSURE EXERTED ON FET BY PROJECTIONS | 15.00 | PSI |
| STRESS | 60.78 | MPa |

It will be appreciated that the outputs generated above, as compared to outputs of prior art cover members (not shown), advantageously promote an optimal amount of heat transfer from the FET 104 to the heat sink 202.

Accordingly, it will be appreciated that the disclosed concept provides for an improved (e.g., without limitation, easier to assemble, better able to distribute pressure on an FET 104, and better able to dissipate heat) electrical switch 200 and mounting assembly 102 therefor.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A mounting assembly for an electrical switch, said electrical switch including a heat sink, said mounting assembly comprising:
a switching member;
an insulator structured to be disposed between said switching member and said heat sink; and
a separate cover member overlaying said switching member and being structured to secure said switching member and said insulator to said heat sink, said separate cover member comprising a body portion and a plurality of protrusions extending outwardly from said body portion, said plurality of protrusions comprising a first protrusion and a second protrusion,
wherein said switching member is disposed between said first protrusion and said second protrusion,
wherein said plurality of protrusions are structured to extend through said heat sink in order to removably couple said separate cover member and said switching member to said heat sink without requiring a separate fastener to be inserted through said separate cover member,
wherein said switching member extends from proximate said first protrusion to proximate said second protrusion;
wherein said body portion comprises a first end portion and a second end portion disposed opposite and distal the first end portion; wherein at least one of said first protrusion and said second protrusion extends from proximate said first end portion; wherein said plurality of protrusions further comprises a third protrusion extending from proximate said second end portion; wherein said body portion further comprises a first side portion and a second side portion disposed opposite and distal said first side portion; wherein said first side portion and said second side portion extend from said first end portion to said second end portion; wherein said first protrusion extends from said first side portion; wherein said second protrusion extends from said second side portion; and wherein said third protrusion is disposed between said first side portion and said second side portion.

2. The mounting assembly of claim 1 wherein said third protrusion is disposed generally midway between said first side portion and said second side portion.

3. The mounting assembly of claim 1 wherein said separate cover member further comprises at least one projection extending from one of said first side portion or said second side portion to proximate the other of said first side portion or said second side portion; and wherein said at least one projection is structured to bias said switching member against said insulator and said heat sink.

4. The mounting assembly of claim 1 wherein said body portion has a number of thru holes in order to dissipate heat from said switching member.

5. The mounting assembly of claim 1 wherein said body portion comprises a surface extending from the first end portion to the second end portion and facing away from said switching member; and wherein said surface is generally planar.

6. The mounting assembly of claim 5 wherein said surface extends from said first side portion to said second side portion.

7. A mounting assembly for an electrical switch, said electrical switch including a heat sink, said mounting assembly comprising:
a switching member;
an insulator structured to be disposed between said switching member and said heat sink; and
a separate cover member overlaying said switching member and being structured to secure said switching member and said insulator to said heat sink, said separate cover member comprising a body portion and a plurality of protrusions extending outwardly from said body portion, said plurality of protrusions comprising a first protrusion and a second protrusion,
wherein said switching member is disposed between said first protrusion and said second protrusion,
wherein said plurality of protrusions are structured to extend through said heat sink in order to removably couple said separate cover member and said switching member to said heat sink without requiring a separate fastener to be inserted through said separate cover member,
wherein said switching member extends from proximate said first protrusion to proximate said second protrusion,
wherein said body portion comprises a first side portion and a second side portion disposed opposite and distal said first side portion; wherein said first protrusion extends from said first side portion; wherein said second protrusion extends from said second side portion; wherein said separate cover member further comprises at least one projection extending from one of said first side portion or said second side portion to proximate the other of said first side portion or said second side portion; wherein said at least one projection is structured to bias said switching member against said insulator and said heat sink; and wherein said at least one projection comprises a first projection and a second projection each structured to bias said switching member against said insulator and said heat sink.

8. The mounting assembly of claim 7 wherein said first projection extends from said first side portion to proximate said second side portion; and wherein said second projection extends from said second side portion to proximate said first side portion.

9. A mounting assembly for an electrical switch, said electrical switch including a heat sink, said mounting assembly comprising:
a switching member;
an insulator structured to be disposed between said switching member and said heat sink; and
a separate cover member overlaying said switching member and being structured to secure said switching member and said insulator to said heat sink, said separate cover member comprising a body portion and a plurality of protrusions extending outwardly from said body portion, said plurality of protrusions comprising a first protrusion and a second protrusion,
wherein said switching member is disposed between said first protrusion and said second protrusion,
wherein said plurality of protrusions are structured to extend through said heat sink in order to removably couple said separate cover member and said switching member to said heat sink without requiring a separate fastener to be inserted through said separate cover member,
wherein said switching member extends from proximate said first protrusion to proximate said second protrusion,
wherein said body portion comprises a first side portion and a second side portion disposed opposite and distal said first side portion; wherein said first protrusion extends from said first side portion; wherein said second protrusion extends from said second side portion; wherein said separate cover member further comprises at least one projection extending from one of said first side portion or said second side portion to proximate the other of said first side portion or said second side portion; wherein said at least one projection is structured to bias said switching member against said insulator and said heat sink; wherein said at least one projection comprises a surface; wherein said cover member further comprises a number of protuberances extending outwardly from said surface of said at least one projection; wherein said surface faces said switching member; and wherein said number of protuberances engage said switching member.

10. The mounting assembly of claim 9 wherein at least one of said number of protuberances is L-shaped.

11. An electrical switch comprising:
a heat sink; and
a mounting assembly comprising:
a switching member,
an insulator disposed between said switching member and said heat sink, and
a separate cover member overlaying said switching member and securing said switching member and said insulator to said heat sink, said separate cover member comprising a body portion and a plurality of protrusions extending outwardly from said body portion, said plurality of protrusions comprising a first protrusion and a second protrusion,
wherein said switching member is disposed between said first protrusion and said second protrusion,
wherein said plurality of protrusions extend through said heat sink in order to removably couple said separate cover member and said switching member to said heat sink without requiring a separate fastener to be inserted through said separate cover member, wherein said switching member extends from proximate said first protrusion to proximate said second protrusion, wherein said body portion comprises a first end portion and a second end portion disposed opposite and distal the first end portion; wherein at least one of said first protrusion and said second protrusion extends from proximate said first end portion; wherein said plurality of protrusions further comprises a third protrusion extending from proximate said second end portion; wherein said body portion further comprises a first side portion and a second side portion disposed opposite and distal said first side portion; wherein said first side portion and said second side portion extend from said first end portion to said second end portion; wherein said first protrusion extends from said first side portion; wherein said second protrusion extends from said second side portion; and wherein said third protrusion is disposed between said first side portion and said second side portion.

12. The electrical switch of claim 11 wherein said separate cover member further comprises at least one projection extending from one of said first side portion or said second side portion to proximate the other of said first side portion or said second side portion; and wherein said at least one projection is structured to bias said switching member against said insulator and said heat sink.

13. The electrical switch of claim 11 wherein said electrical switch is a dimmer switch; and wherein said switching member is a FET.

14. An electrical switch comprising:
a heat sink; and
a mounting assembly comprising:
a switching member,
an insulator disposed between said switching member and said heat sink, and
a separate cover member overlaying said switching member and securing said switching member and said insulator to said heat sink, said separate cover member comprising a body portion and a plurality of protrusions extending outwardly from said body portion, said plurality of protrusions comprising a first protrusion and a second protrusion, wherein said switching member is disposed between said first protrusion and said second protrusion, wherein said plurality of protrusions extend through said heat sink in order to removably couple said separate cover member and said switching member to said heat sink without requiring a separate fastener to be inserted through said separate cover member, wherein said switching member extends from proximate said first protrusion to proximate said second protrusion, wherein said body portion comprises a first side portion and a second side portion disposed opposite and distal said first side portion; wherein said first protrusion extends from said first side portion; wherein said second protrusion extends from said second side portion; wherein said separate cover member further comprises at least one projection extending from one of said first side portion or said second side portion to proximate the other of said first side portion or said second side portion; wherein said at least one projection is structured to bias said switching member against said insulator and said heat sink; wherein said at least one projection comprises a first projection and a second projection each biasing said switching member against said insulator and said heat sink; wherein said first projection extends from said first side portion to proximate said second side portion; and wherein said second projection extends from said second side portion to proximate said first side portion.

15. The electrical switch of claim 14 wherein said body portion comprises a first end portion and a second end portion disposed opposite and distal the first end portion; wherein at least one of said first protrusion and said second protrusion extends from proximate said first end portion; and wherein said plurality of protrusions further comprises a third protrusion extending from proximate said second end portion.

16. The electrical switch of claim 15 wherein said first side portion and said second side portion extend from said first end portion to said second end portion.

* * * * *